Jan. 3, 1967 H. F. H. WIGTON 3,296,040

EPITAXIALLY GROWING LAYERS OF SEMICONDUCTOR THROUGH OPENINGS IN OXIDE MASK

Filed Aug. 17, 1962

INVENTOR.
HENRY F. H. WIGTON

BY

Lippincott, Ralls & Hendricson

ATTORNEYS

United States Patent Office 3,296,040

Patented Jan. 3, 1967

3,296,040

EPITAXIALLY GROWING LAYERS OF SEMICONDUCTOR THROUGH OPENINGS IN OXIDE MASK

Henry F. H. Wigton, Palo Alto, Calif., assignor to Fairchild Camera and Instrument Corporation, Syosset, Long Island, N.Y., a corporation of Delaware Filed Aug. 17, 1962, Ser. No. 217,687
5 Claims. (Cl. 148—175)

This invention relates to a new process for controlled epitaxial growth of semiconducting materials. Specifically, the invention provides a method for epitaxially growing a partial layer of semiconductor material having any desired geometric configuration by halide decomposition on a substrate while leaving the remainder of the substrate surface protected by oxide coating.

It is well known that semiconductors may be prepared having epitaxially-grown layers. Layers grown this way have the same crystal orientation as the original substrate. Epitaxial growth may be carried out by vapor deposition or by halide decomposition. The former is a high temperature process wherein semiconductor material is vaporized and deposited upon the substrate. The latter is carried out at lower temperatures to decompose a germanium or silicon halide and deposit a layer of semiconductor material on a substrate.

In the prior art, when only a partial epitaxially-grown layer with an oxide-coated remainder was desired, a four-step process was used. An epitaxially-grown layer was deposited first over the entire substrate. Then the undesired portions of the layer were removed by etching, drilling, or other methods known in the art. Next, a layer of oxide was formed over the entire surface to protect the portions of the substrate exposed by removal of part of the epitaxial layer. Finally, to re-expose the remainder of the epitaxially grown layer in order to attach electrodes, the oxide over it was removed.

Rather than grow an entire epitaxial layer and then etch away portions of it, it would be preferable to mask the portions where epitaxial growth is not wanted to limit the epitaxial growth to the desired portions only. However, when this is attempted with conventional metal masking, e.g., molybdenum, epitaxial growth occurs not only in the unmasked portion, but also on the metal mask itself. The mask is buried by the epitaxial layer. It is then extremely difficult to remove the mask while still retaining a clearly defined epitaxially grown portion.

Oxide masking would be a possible alternative to metal masking, but it has not heretofore been considered for epitaxial growth by halide decomposition for two reasons:

(1) Silicon is known to adhere strongly to its oxide; therefore unwanted deposition of silicon would be expected on the surface of the masked portion as well as on the unmasked; and (2) It is known that in epitaxial growth processes by vapor deposition, the oxide masking is removed during deposition, thereby destroying its masking effect.

Therefore, the four-step process of (a) growing an epitaxial layer over the entire surface by halide decomposition, (b) etching away the unwanted portions, (c) reoxidizing, and (d) etching away the oxide over the remaining epitaxial portions, is generally considered to be the most satisfactory way of obtaining a partial epitaxial layer by halide decomposition with an oxide coating over the remainder.

In complete contradiction to what is expected from the experience of the art, it has now been discovered that when silicon oxide is used as a mask for epitaxial growth by halide decomposition:

(1) There is substantially no deposition of silicon on the mask even though silicon is known to adhere very strongly to silicon dioxide; and (2) None of the oxide mask is removed during deposition. From the lack of silicon deposition on the oxide, it would be logical to conclude that silicon oxide must in some way inhibit epitaxial growth near it; however, the very opposite situation was found—epitaxial growth was greatly accelerated by the presence of the masking. In fact, epitaxial growth was at least two to three times as fast with oxide masking as it was without. The method of the invention makes possible the rapid manufacture of an oxide-protected semiconductor having an epitaxially grown layer over one portion of the substrate and oxide protection over the remainder. The process has particular application for the manufacture of transistors, Zener diodes, mesa diodes, integrated circuits, and the like.

Reduced to its essentials, the method of the invention has two principal steps. First, a portion of the surface of a semiconductor substrate, e.g., silicon, germanium, or gallium arsenide, preferably silicon, is masked with a layer of silicon oxide. When the substrate is silicon, the entire surface of the substrate is usually oxidized and the portions of the oxide that are not desired are etched away. Or, the surface of the substrate may be masked with conventional metal masking over the portions where silicon oxide is not desired and silicon oxide then vacuum-deposited over the remainder of the surface by conventional means. After masking with oxide, the surface is exposed to a halide decomposing epitaxial growth atmosphere at a temperature in the range between about 1100° and 1428° C., the act of exposing the surface to the atmosphere being controlled by a gas flow rate and deposition time in that temperature range for leaving a substantial portion of the oxide layer intact when deposition is completed, for obtaining a layer of semiconductor deposited on the unmasked surface, and for leaving the surface of the remaining intact oxide layer substantially free of deposited semiconductor. Such an atmosphere generally contains a gaseous halide, such as a halide of silicon or germanium, or, in the case of gallium arsenide, hydrogen chloride. With silicon or germanium halides, a reducing gas, e.g., hydrogen, is used. With certain halides, disproportionation occurs and the reducing gas is not required. A layer of the semiconductor material is epitaxially deposited on the unmasked portion of the substrate surface, while the oxide-covered portions are left substantially free of deposit. Both the resistivity and the conductivity type of the epitaxial layer may be controlled in the process. The resulting semiconductor body has an oxide-protected portion of the original substrate, and an exposed epitaxial layer to which the electrodes may be attached if desired.

The method of the invention may be better understood by reference to the following more detailed description and the drawings, in which:

FIGS. 1A–B are a series of representational, somewhat schematic, greatly enlarged transverse sections showing the steps of the method of the invention;

Initially, the substrate (e.g., silicon) is prepared by oxidation of at least one surface. Silicon oxidation occurs readily in an oxidizing atmosphere at temperatures from about 900°–1200° C. The oxide is strongly adherent to the silicon. The oxidizing atmosphere is provided with air, oxygen, water vapor, or other known oxidizing agents. Time and temperature depend upon the oxide thickness desired. Oxide thickness required for satisfactory masking depends upon the severity of the conditions to be used for epitaxial growth. These, in turn, are governed by the desired thickness of the epitaxially grown layer. To obtain a thicker epitaxial layer, time and temperature of the epitaxial growth process are increased, thus creating more severe conditions. A thicker coating of oxide masking is then desirable to prevent epitaxial growth through the oxide mask. Practical limits of about 2–3 microns thickness of the mask occur because conventional coating methods become too slow beyond this range. A minimum thickness of about 1 micron, preferably 1.5 microns, is desirable.

Figure 1:
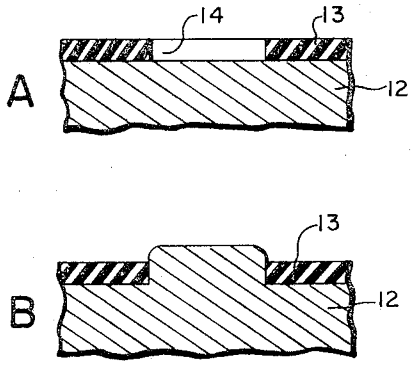

Referring now to FIG. 1A, a body of silicon 12 has been oxidized to provide a silicon oxide layer 13 on its upper surface. Hole 14 is then etched in the silicon oxide by photoengraving. The details of the engraving process may be found in Transistor Technology, D. Van Nostrand Company, Inc., Princeton, N.J., 1958, vol. 3, page 151.

Figure 2:
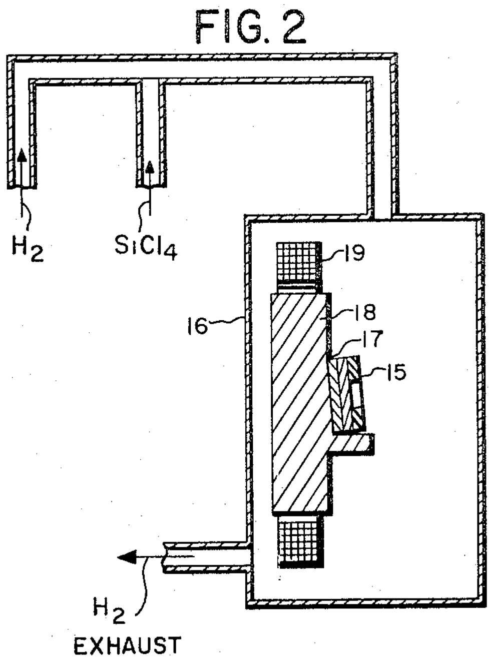
FIG. 2 is a schematic illustration of one possible apparatus useful for carrying out the invention.

The substrate is now ready for epitaxial growth. One possible apparatus which may be used to deposit the epitaxial layer formed, for example, by the hydrogen reduction of silicon tetrachloride is shown schematically in FIG. 2. Previously masked substrate wafer 15 is mounted within chamber 16 in contact with mandrel surface 17. In the apparatus shown, this surface 17 is plated with silicon of high resistivity. Alternatively, a separate wafer of high resistivity silicon may be placed between the mandrel and the substrate. This high resistivity silicon also deposits on the back side of the substrate wafer in the process. The principal advantages of this arise where the substrate is of relatively low resistivity and a high resistivity epitaxial layer is desired. If the protective layer of high resistivity silicon were not adjacent to the back of the low resistivity substrate, the low resistivity material from the back of the substrate would, to some extent, enter the atmosphere and contaminate the epitaxial layer on the front with impurities. Where the substrate is of high resistivity, or the epitaxial layer desired has low resistivity, then the intervening layer of silicon between mandrel and substrate is unnecessary.

The substrate is heated to deposition temperature by means of an induction coil 19 within mandrel 18. For silicon, this temperature is generally from about 1100° C. to 1428° C., the latter being the melting point of silicon. Preferably, a temperature in the range of 1250°–1350° C. is used. Once the substrate has reached deposition temperature, the silicon tetrachloride-hydrogen mixture is introduced, as illustrated, for the required period of time. As is well known in the art, deposition rate is controlled by regulating temperature, ratio of silicon tetrachloride to hydrogen, gas flow rate, and deposition time. These variables may all be easily selected by the practitioner.

When using silicon tetrachloride which has been purified prior to reaction, the epitaxial layer is usually N-type with a resistivity between about 20 and 100 ohm-centimeters. Where a lower resistivity film is desired, a dopant is added to the atmosphere. A shallow-level impurity is used, preferably boron tribromide or phosphorus trichloride for P-type and N-type films, respectively, because they may be easily mixed with the silicon tetrachloride. However, antimony, arsenic, indium, aluminum, or gallium could also be used. Both the resistivity and the conductivity type of the epitaxial layer are controlled while it is formed. The amount or ratio of these dopants can be changed during the growth procedure, thereby producing a programmed layer of continuously varying resistivity or conductivity types. By this method, it is possible to produce resistivity gradients running either inward from the wafer surface or outward from the substrate.

Although silicon tetrachloride was used in the above example, silicon iodide, silicon bromide, trichlorosilane, or other reducible silicon compound may be substituted. When silicon iodide is used, a lower substrate temperature, e.g., from about 900°–1100° C., is preferable. A vacuum system rather than a hydrogen system gives best results because the reaction is mainly disproportionation rather than reduction. After deposition, the device is shown in FIG. 1B. No semiconductor deposits upon oxide layer 13.

The process of this invention has many distinct advantages. It can handle many substrate wafers, for example, at the same time. In addition, this process makes possible the manufacture of smaller mesa transistors than heretofore. These transistors are particularly useful as strain gauges, Zener diodes, and the like. The method of the invention permits all the highly developed oxide masking techniques previously limited to diffusion processes to be applied now to epitaxial growth by halide decomposition as well.

Figure 3:
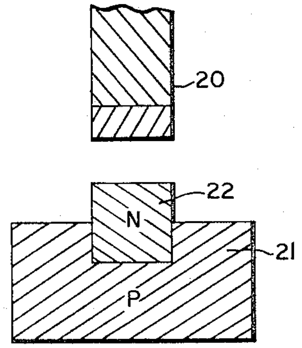
FIG. 3 is a somewhat schematic, greatly enlarged transverse section showing the parts of a diode made by the method of the invention.

One application of the invention is in making planar diodes of either polarity. Referring to FIG. 3, a planar diode is observed made by smashing a contact 20 onto a diode 21 having regions of both conductivity types, as shown. Conventionally, both regions have a common planar upper surface. One of the regions was indiffused into the other. The indiffused regions was usually silver plated, and electrical contact with this region was made by smashing a contact onto the silver-plated region. The device was then immediately encapsulated. However, where the diffused region was N-type, electroplating would not work because it requires that the surface to be plated must have electrons flowing towards it. These electrons combine with the silver ions, for example, to plate out silver. If the surface were N-type, however, the electron flow would have to be across the junction from P-type material to N-type material—the direction of reverse bias. It was not possible to obtain sufficient current flow in this direction for electroplating. With conventional planar diodes, therefore, the diffused region was always P-type. Using the method of the invention, however, diffused region 22 can be epitaxially grown above the surface of the device and no plating is required to achieve a secure contact by smashing contact 20 onto the epitaxial extension.

Figure 4:
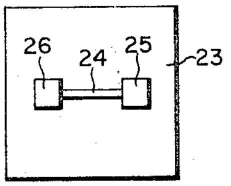
FIG. 4 is a plan view of a strain gauge made by the method of the invention.

Another application for the invention is a strain gauge. A plan view of such a device is shown in FIG. 4. On a substrate 23 of one conductivity type, the strain element 24 of the opposite conductivity type and contacts 25 and 26 are deposited epitaxially according to the method of the invention. Strain measuring element 24 provides a measurable variation in resistance dependent upon the strain placed on the device. Leads are attached in a conventional manner to contacts 25 and 26. The resistance across these leads is used as an indication of the strain.

Figure 5:
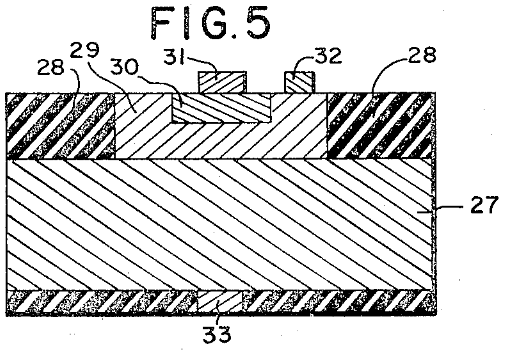
FIG. 5 is a somewhat schematic, greatly enlarged transverse section of a transistor made by the method of the invention.

Transistors may also be made by the method of the invention. One representative device is shown in FIG. 5. It is made by starting with a block of semiconductor material 27, e.g., silicon, having an oxide coated surface 28. A hole is etched in this oxide in order to grow the base region 29 of the transistor epitaxially by the method of the invention. The surrounding oxide 28 masks the surface of the semiconductor around the opening in which the base 29 is to be grown. An emitter region 30 is then diffused into the base. Alternatively, this emitter region can be grown epitaxially by changing the content of the epitaxial growth atmosphere during growth, forming thereby a grown junction. The emitter 30 may also be formed by alloying it to the base, or by a rectifying contact to the base; other methods are well known in the art.

If desired, the surrounding oxide 28 may be etched away leaving a mesa, or the oxide may remain for protection.

Contacts 31, 32 and 33 with the transistor regions are easily made at the surfaces, as shown.

Figure 6:
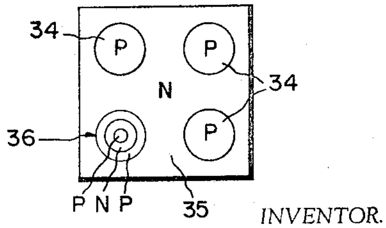
FIG. 6 is a plan view of an integrated circuit device made by the method of the invention.

Another very useful device may be made by the method of this invention. It is possible to grow a plurality of isolated islands in a body of semiconductor material. Referring to FIG. 6, a plurality of islands 34 of one conductivity type (P-type in the illustration) are grown on a body of semiconductor material 35 of the opposite conductivity type (N-type). N-type block 35 is oxide-masked and holes are etched in this oxide masking for each of islands 34. These islands 34 are epitaxially grown in the holes in the oxide masking according to the method of this invention. Regions of a semiconductor device may be diffused into each island 34, as shown at 36, by methods well known in the art. Each of the devices located in one of the islands is isolated from the others so located. Leads may be formed between devices over the oxide masking to insulate them from the substrate. The result is an integrated semiconductor circuit, such as is now prevalent in the semiconductor art.

The following examples are illustrative of the process of the invention. They are presented only for illustrative purposes and they are therefore not to be construed as placing limitations upon the scope of the invention. The first example is comparative to show the advantages of the invention.

*Example I*

Two one-inch diameter silicon wafers were subjected to epitaxial growth as previously described. One had a portion of its surface masked with a 3–4 micron layer of silicon oxide according to the teachings of the invention; the other was unmasked. The wafers were heated to about 1300° C. in an apparatus similar to that illustrated in FIG. 2. Hydrogen and trichlorosilane in a molar ratio of about 128:1 were introduced. Trichlorosilane was introduced at the rate of 1 cc./min. and hydrogen at the rate of 1 cu. ft./min. (all at standard temperature and pressure). After about five minutes, the wafers were removed and the thickness of the epitaxially grown layers on the masked and unmasked wafers were measured and compared. The thickness of the layer on the masked wafer was more than three times that of the unmasked wafer. Substantially no deposition of silicon occurred on the masking itself. The thickness of the oxide masking was measured after deposition of the epitaxial layer and found to be substantially unchanged from before.

*Example II*

A layer of silicon dioxide about 10,000 A. thick was pyrolytically deposited on a wafer of P-type gallium arsenide. Rectangularly shaped holes were etched in the silicon dioxide caused by a photo-resist process well known in the art. The oxide-coated side of the wafer was placed against an N-type gallium arsenide source wafer and both were heated to about 925° C. for five minutes in an epitaxial growth atmosphere where hydrogen (at 0.4 cu. ft. per min.) and hydrogen chloride (at 395 cc. per min.) were passed in contact with them. N-type gallium arsenide deposited in the rectangular holes of the silicon dioxide and formed a plurality of junctions with the wafer. However, the surface of the silicon dioxide was substantially free of gallium arsenide deposits. After the epitaxial growth of gallium arsenide in the holes of the coating, the silicon dioxide itself was still present as a mask.

Many variations may be made in the process of the invention as above described without departing from its spirit and scope. Therefore, the only limitations to be placed on the scope of the invention are those expressed in the following claims.

What is claimed is:

1. Method of depositing a layer of semiconductor material by epitaxial growth by halide decomposition over a portion of the surface of a semiconductor substrate while leaving the remainder of said surface substantially free of deposited semiconductor, which comprises:
   - covering said remainder of said surface with a silicon oxide layer, and
   - exposing said surface to a halide decomposing epitaxial growth atmosphere at a temperature in the range between about 1100° and 1428° C., the act of exposing said surface to said atmosphere being controlled by a gas flow rate and deposition time in said temperature range for leaving a substantial portion of said oxide layer intact when deposition is completed, for obtaining a layer of semiconductor deposited on said portion of said surface, and for leaving the surface of said intact oxide layer substantially free of deposited semiconductor.

2. Method of claim 1 wherein said semiconductor material is silicon.

3. Method of claim 2 wherein said halide decomposing epitaxial growth atmosphere contains hydrogen and a halide of silicon.

4. Method of claim 2 wherein said substrate is silicon.

5. Method of claim 3 wherein said atmosphere also contains at least one dopant.

References Cited by the Examiner

UNITED STATES PATENTS

| | | | |
|---|---|---|---|
| 2,858,489 | 10/1958 | Henkels | 317—235 |
| 2,945,286 | 7/1960 | Darendorf | 317—235 |
| 2,972,092 | 2/1961 | Nelson | 317—235 |
| 2,981,877 | 4/1961 | Noyce | 317—235 |
| 2,995,473 | 8/1961 | Levi | 117—5.5 |
| 3,000,768 | 9/1961 | Marinace | 317—235 X |
| 3,049,685 | 8/1962 | Wright | 73—88.5 |
| 3,064,167 | 11/1962 | Hoerni | 317—234 |
| 3,089,794 | 5/1963 | Marinace | 317—235 X |
| 3,156,591 | 10/1964 | Hale et al. | 148—175 |

OTHER REFERENCES

ISA Journal, May 1962, vol. 9, No. 5, pages 38, 39, 40.

JAMES D. KALLAM, *Primary Examiner.*

JOHN W. HUCKERT, *Examiner.*